(12) United States Patent
Ichiki et al.

(10) Patent No.: US 9,608,020 B2
(45) Date of Patent: Mar. 28, 2017

(54) IMAGING ELEMENT MOUNTING SUBSTRATE AND IMAGING DEVICE

(71) Applicant: KYOCERA Corporation, Kyoto-shi, Kyoto (JP)

(72) Inventors: Shinji Ichiki, Kyoto (JP); Yousuke Moriyama, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/029,916

(22) PCT Filed: Oct. 20, 2014

(86) PCT No.: PCT/JP2014/078093
§ 371 (c)(1),
(2) Date: Apr. 15, 2016

(87) PCT Pub. No.: WO2015/060345
PCT Pub. Date: Apr. 30, 2015

(65) Prior Publication Data
US 2016/0254302 A1    Sep. 1, 2016

(30) Foreign Application Priority Data

Oct. 23, 2013 (JP) ................. 2013-220261

(51) Int. Cl.
*H01L 31/0203* (2014.01)
*H01L 27/146* (2006.01)
*H01L 23/498* (2006.01)

(52) U.S. Cl.
CPC .. *H01L 27/14618* (2013.01); *H01L 23/49822* (2013.01); *H01L 23/49838* (2013.01); *H01L 2224/16225* (2013.01)

(58) Field of Classification Search
CPC ............. H01L 23/49822; H01L 25/162; H01L 25/165; H01L 25/167
USPC ................................ 257/433, 676, 729, 731
See application file for complete search history.

(56) References Cited

U.S. PATENT DOCUMENTS

2004/0207999 A1* 10/2004 Suehiro ................ G02B 6/0018
  362/84
2013/0128109 A1* 5/2013 Ichiki ................ H01L 27/14618
  348/374

FOREIGN PATENT DOCUMENTS

JP        2006-201427 A    8/2006

* cited by examiner

*Primary Examiner* — Brook Kebede
(74) *Attorney, Agent, or Firm* — Volpe and Koenig, P.C.

(57) ABSTRACT

An imaging element mounting substrate includes: an insulating base comprising insulating layers, the insulating base surface comprising an opening which is located at a center thereof; a connection electrode disposed at a lower surface of the insulating base around the opening; and light-transmission control layers between the insulating layers, and comprising inner edges located on an outside of the opening. An inner edge of one light-transmission control layer lies closer to the opening than an inner edge of another light-transmission control layer as seen in a transparent plan view, and the insulating base has, in an inner periphery of the opening of an insulating layer constituting a lower surface of the insulating base, an inclined portion which is inclined such that the opening becomes smaller in size from the lower surface as approaching an upper surface of the insulating base.

9 Claims, 5 Drawing Sheets (a)

(b)

(a)

(b)

(a)

(b)

IMAGING ELEMENT MOUNTING SUBSTRATE AND IMAGING DEVICE

TECHNICAL FIELD

The present invention relates to an imaging element mounting substrate for the mounting of an imaging element such for example as a CCD (Charge Coupled Device) type imaging element or a CMOS (Complementary Metal Oxide Semiconductor) type imaging element, as well as to an imaging device.

BACKGROUND ART

There is a heretofore known imaging device applicable to a digital camera, an optical sensor, and so forth, which mounts an imaging element of CCD type, CMOS type, or other type on an insulating base. As such an imaging device, there is known one comprising: an insulating base having an opening formed at a center thereof and a recess formed at its lower surface, the opening being located inside the recess as seen in a plan view; and an imaging element flip-chip mounted on a bottom surface of the recess of the insulating base (refer to Patent Literature 1, for example). In the insulating base, a connection electrode is placed around the opening of its lower surface, and an external electrode is placed on the outer periphery of the recess. For example, such an imaging device is designed to convert light (image) inputted to a light-receiving section of the imaging element through the opening into an electric signal by the imaging element, and transmit the electric signal to a connection electrode of the insulating base.

CITATION LIST

Patent Literature

Patent Literature 1: Japanese Unexamined Patent Publication JP-A 2006-201427

SUMMARY OF INVENTION

Technical Problem

However, for example, in the case where the insulating base is formed of ceramics, when ceramic green sheets for forming insulating layers that constitute the insulating base are stacked on top of one another and the stacked body is pressurized, an area around the opening in the insulating base may become deformed so as to sag down due to lack of a part to support this area in a position immediately below the vicinity of the opening, which results in the possibility of a contact of the area around the opening in the insulating base with an imaging element mounted on the insulating base. In this regard, to suppress the contact between the area around the opening and the imaging element even with occurrence of deformation in this area, there has been an attempt to form a cutaway around the opening to reduce a thickness of the insulating base in a stepwise manner. However, in the presence of the cutaway formed around the opening to reduce the thickness of the insulating base, light which has been transmitted through the thinned area of the insulating base may be received by the imaging element, which results in the possibility of occurrence of noise in image reception.

The invention has been devised in view of the problem associated with the related art as mentioned supra, and accordingly an object of the invention is to provide an imaging element mounting substrate capable of reducing transmission of light incident on an imaging device through an insulating base, and consequently achieving noise reduction in image reception, as well as to provide an imaging device.

Solution to Problem

According to one embodiment of the invention, an imaging element mounting substrate comprises: an insulating base comprising a plurality of insulating layers, a surface of the insulating base comprising an opening which is located at a center of the insulating base; a connection electrode disposed at a lower surface of the insulating base so as to be around the opening, the connection electrode connectable to an imaging element; and a plurality of light-transmission control layers which are between the plurality of insulating layers, respectively, the plurality of light-transmission control layers surrounding the opening, being disposed overlapping one another in large part as seen in a plan view of the imaging element mounting substrate, and comprising inner edges located on an outside of the opening, an inner edge of one of the plurality of light-transmission control layers lying closer to the opening than an inner edge of another one of the plurality of light-transmission control layers as seen in the plan view of the imaging element mounting substrate, and, the insulating base having, in an inner periphery of the opening of an insulating layer constituting a lower surface of the insulating base, an inclined portion which is inclined such that the opening becomes smaller in size from the lower surface as approaching an upper surface of the insulating base.

According to another embodiment of the invention, an imaging device comprises the imaging element mounting substrate configured as above and an imaging element connected to the connection electrode.

Advantageous Effects of Invention

According to the imaging element mounting substrate according to the invention, the inner edge of one of the plurality of light-transmission control layers lies closer to the opening than the inner edge of the another one of the plurality of light-transmission control layers as seen in a plan view of the imaging element mounting substrate, and, the inclined portion is formed around the opening in the insulating base. Thus, in contrast to a case where, for example, a cutaway is formed around the opening, it is possible to suppress an excessive decrease in the thickness of a part of the insulating base located around the opening, and thereby reduce transmission of light through the part of the insulating base located around the opening. Moreover, the light-transmission control layer interposed between the insulating layers achieves further reduction in light transmission successfully. This makes it possible to suppress entry of unnecessary light into the imaging element, and thereby obtain good images. Moreover, the insulating base has, in the inner periphery of the opening of the insulating layer constituting the lower surface of the insulating base, the inclined portion which is inclined such that the opening becomes gradually smaller in size from the lower surface as approaching the upper surface of the insulating base. By virtue of the inclined portion, a space is left around the opening at the lower surface, thus restraining the area around the opening against contact with the imaging element.

The imaging device according to the invention comprises the thereby constructed imaging element mounting substrate, and therefore it is possible to suppress entry of unnecessary light into the imaging element, and thus obtain good images.

DESCRIPTION OF EMBODIMENTS (First Embodiment)

Figure 1:
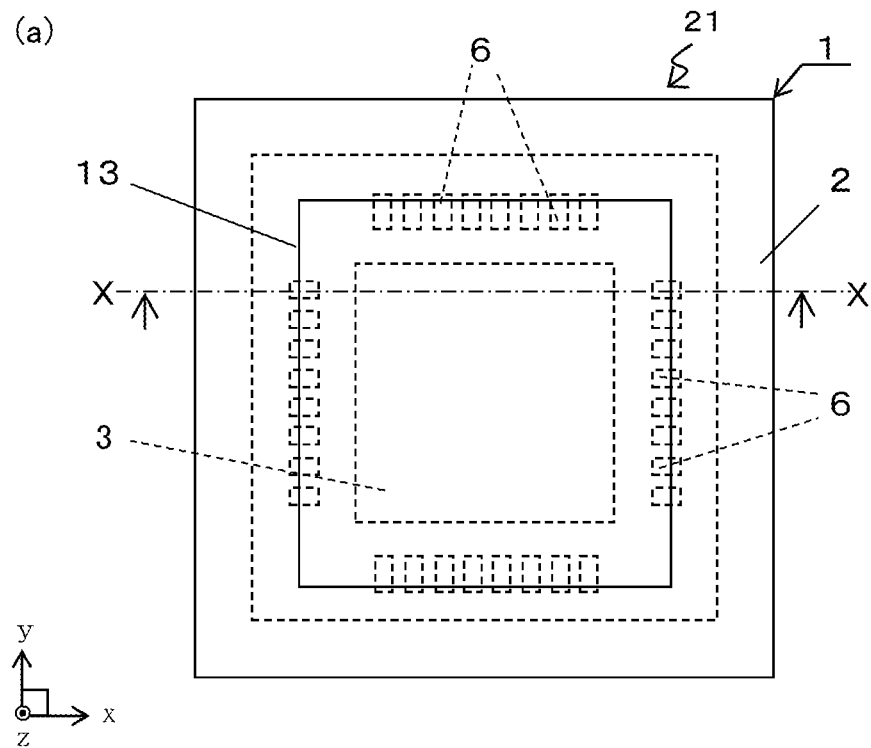
FIG. 1(a) is a plan view showing an imaging device in accordance with an embodiment of the invention.
FIG. 1(b) is a longitudinal sectional view taken along the line X-X shown in FIG. 1(a), illustrating a cross section of the imaging device in accordance with a first embodiment of the invention.
Figure 1:
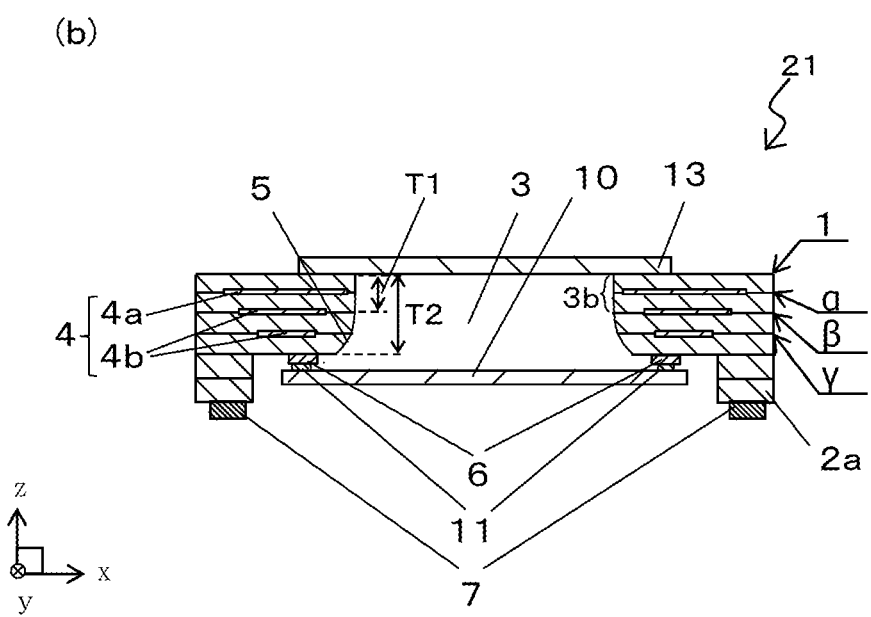

Hereinafter, several exemplificative embodiments of the invention will be described with reference to drawings.

An imaging device in accordance with an embodiment of the invention will be described with reference to FIGS. 1 to 3. An imaging device 21 of this embodiment comprises: an imaging element mounting substrate 1; an imaging element 10 disposed so as to overlap an opening 3 formed in the imaging element mounting substrate 1; and a lid body 13 disposed so as to overlap the imaging element 10 as seen in a plan view of the imaging element mounting substrate 1. Although either side of the imaging device 21 may be an upper side or a lower side, an x-y-z rectangular coordinate system is defined for purposes of convenience, and, the term "upper surface" or "lower surface" is used on the assumption that, in a longitudinal sectional view, an upward direction conforms to a positive direction along the z axis of the system.

The imaging element mounting substrate 1 comprises: an insulating base 2 composed of a plurality of insulating layers 2a, the insulating base 2 being provided with an opening which is located at a center of the insulating base; a connection electrode 6 disposed so as to be around the opening 3 of the insulating base 2, the connection electrode 6 being electrically connected to the imaging element 10 (an electrode of the imaging element 10); and an external electrode 7 placed on a lower surface of the insulating base 2, the external electrode 7 being electrically connected to an external circuit (not shown in the drawing).

For example, the insulating base 2 is composed of a plurality of insulating layers 2a which are vertically stacked, are formed in a substantially quadrangular shape, and are made of electrically insulating ceramics such as an aluminum oxide sintered body, a mullite sintered body, a silicon carbide sintered body, an aluminum nitride sintered body, a silicon nitride sintered body, or a glass ceramics sintered body, or resin (plastic) such as epoxy resin, polyimide resin, acrylic resin, phenol resin, polyester resin, or fluorine resin typified by tetrafluoroethylene resin.

While the insulating base 2 is, as exemplified in FIG. 1, formed of a stack of 6 insulating layers 2a, the number of the insulating layers 2a is not limited to any particular value so long as the insulating base 2 is composed of 3 or more insulating layers 2a. In the exemplification shown in FIG. 1, the insulating base 2 is composed of 6 insulating layers 2a, and, two of them located closer to the lower surface of the insulating base 2 are made larger in opening size than the other four insulating layers 2a located closer to an upper surface to define a stepped portion between the four upper surface-side insulating layers 2a and the two lower surface-side insulating layers 2a. Thus, the insulating base 2 is designed to have a hole formed therethrough from the bottom surface of the recess at the lower surface to the upper surface. Moreover, where the insulating layers 2a are so designed that their openings have the same size, the imaging element mounting substrate 1 has the form of a flat plate.

Moreover, the connection electrode 6 is disposed at the lower surface of the insulating base 2 so as to be around the opening 3 for connection with the imaging element 10. In the exemplification shown in FIGS. 1 to 3, the connection electrode 6 is disposed at the lower surface of the upper surface-side insulating layer 2a defining the stepped portion (in top-to-bottom order, the fourth insulating layer 2a) so as to be around the opening 3. As practiced in the exemplification shown in FIGS. 1 to 3, the lower surface of the upper surface-side insulating layer 2a defining the stepped portion (in top-to-bottom order, the fourth insulating layer 2a) may be regarded as to being equivalent to "the lower surface of the insulating base 2". Moreover, in the case of designing the insulating layers 2a so that their openings have the same size in a plan view in forming the opening 3 of the insulating base 2, the imaging element mounting substrate 1 has the form of a flat plate, and, in this case, the connection electrode 6 is disposed at the lower surface of the lowermost insulating layer 2a so as to be around the opening 3.

The external electrode 7, which is intended to establish connection with an external circuit, is disposed on the lower surface of the insulating base 2. In the exemplification shown in FIG. 1, the external electrode 7 is disposed on the lower surface of the lowermost insulating layer 2a and located on the outer periphery of the lower surface of the insulating base 2. Moreover, a wiring conductor may be provided inside the insulating base 2, and, in this case, the external electrode 7 and the connection electrode 6 may be electrically connected to each other via the wiring conductor. It is possible to place the external electrode 7 on the side surface or the upper surface of the insulating base 2.

In the case where the insulating base 2 is made of electrically insulating ceramics, the connection electrode 6 and the external electrode 7, and the wiring conductor as well, are each constructed of a metallized conductor such as tungsten (W), molybdenum (Mo), manganese (Mn), silver (Ag), or copper (Cu). On the other hand, where the insulating base 2 is made of resin, the connection electrode 6 and the external electrode 7 are each made of a metal material such as copper (Cu), gold (Au), aluminum (Al), nickel (Ni), chromium (Cr), molybdenum (Mo), titanium (Ti), or alloys of those metals.

To protect the connection electrode 6 and the external electrode 7 against oxidation, as well as to establish satisfactory electrical connection with the imaging element 10 and the external circuit, it is advisable that the exposed surfaces of the connection electrode 6 and the external electrode 7 are coated with a Ni plating layer having a thickness of 0.5 to 10 µm, or coated with this Ni plating layer and a gold (Au) plating layer having a thickness of 0.5 to 3 µm one after the other.

Figure 2:
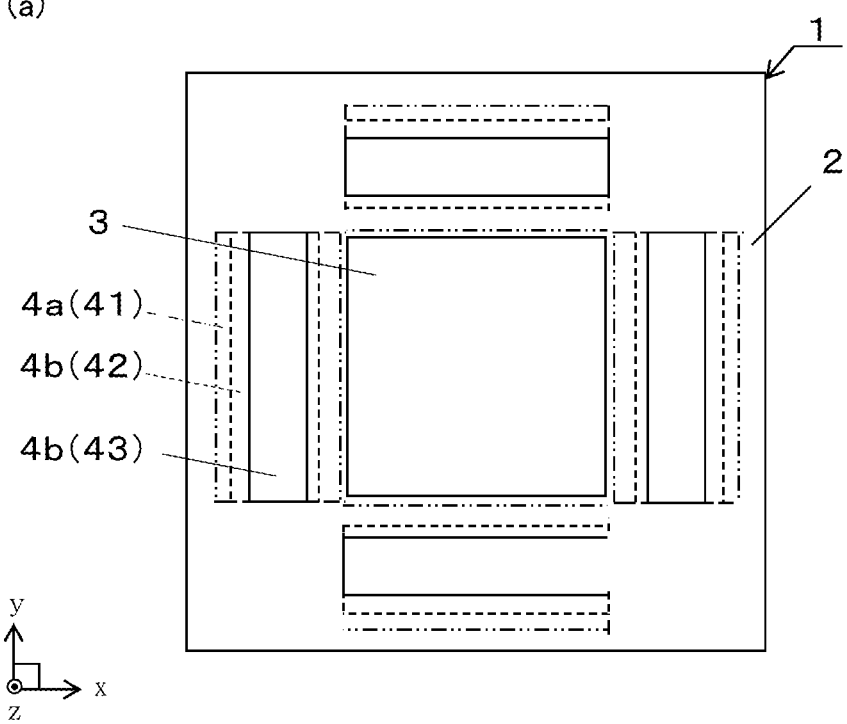
FIGS. 2(a) and 2(b) are each a plan view showing an example of the condition of a light-transmission control layer placed in an inter-insulating layer region (y) in the imaging element mounting substrate shown in FIG. 1 as viewed from below the lower surface.
Figure 2:
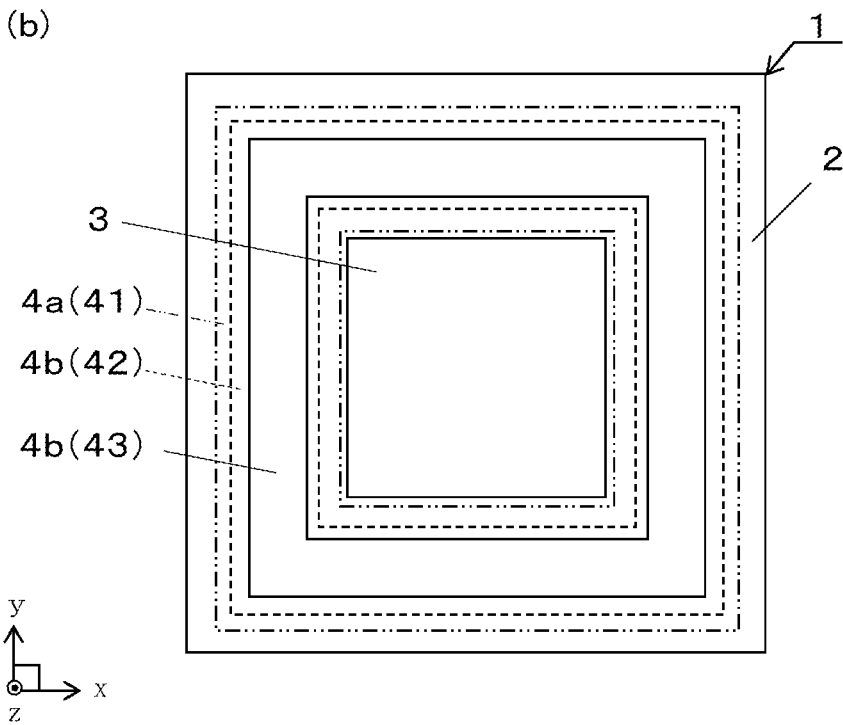
Figure 3:
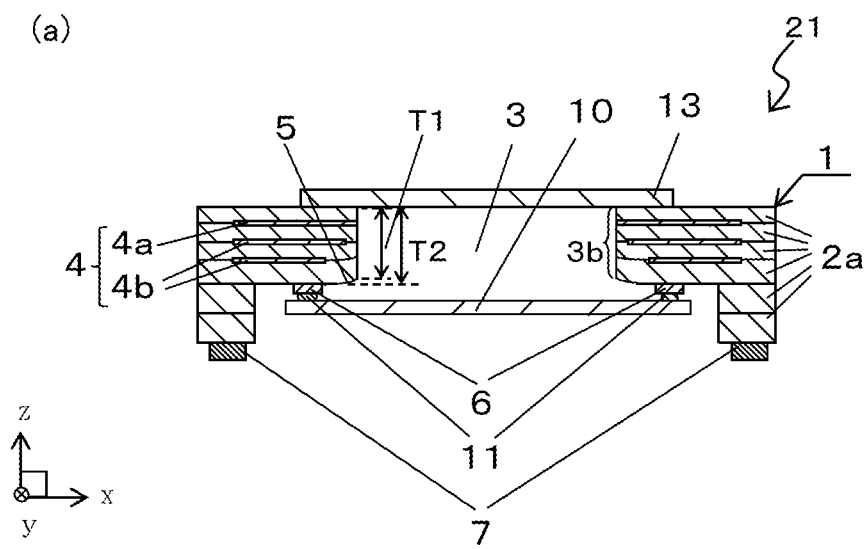
FIGS. 3(a) and 3(b) are each a longitudinal sectional view showing a modified example of the imaging device in accordance with the first embodiment of the invention.
Figure 3:
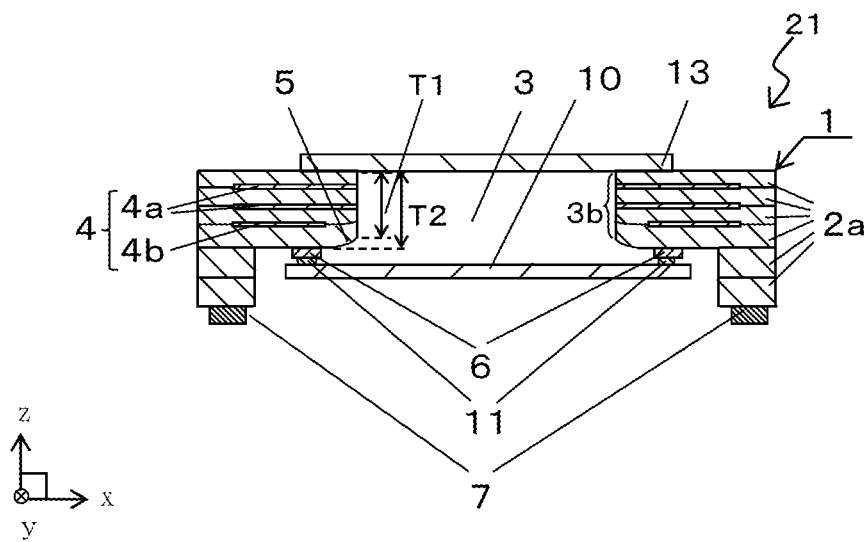

As practiced in the exemplification shown FIGS. 1 to 3, a plurality of light-transmission control layers 4 are disposed so as to overlap one another in large part as seen in the plan view of the imaging element mounting substrate 1, are each interposed between the plurality of insulating layers 2a, and surround the opening 3. The inner edge of each of the plurality of light-transmission control layers 4 is located on an outside of the opening 3 as seen in the plan view of the imaging element mounting substrate 1. The plurality of light-transmission control layers 4 include one light-transmission control layer 4a and other light-transmission control layers 4b than the one light-transmission control layer 4a. The inner edge of the one light-transmission control layer 4a lies closer to the opening 3 than the inner edge of the other light-transmission control layers 4b as seen in the plan view of the imaging element mounting substrate 1. With such an arrangement of the light-transmission control layers 4, in the inner periphery of the opening of the insulating layer constituting the lower surface of the insulating base 2, there is formed an inclined portion 5 inclined such that the opening 3 becomes gradually smaller in size from the lower surface as approaching the upper surface of the insulating base 2. That is, during the production of the imaging element mounting substrate 1 according to the invention, each of the light-transmission control layers 4 is interposed between green sheets for forming the individual the insulating layers 2a in accordance with the aforementioned arrangement, and, in this case, when the green sheets for forming the plurality of insulating layers 2a are stacked together under pressure, a region where the one light-transmission control layer 4a and the other light-transmission control layer 4b do not overlap each other or overlap a little each other is smaller in thickness than a region where there is a full overlap of these layers as seen in the plan view of the imaging element mounting substrate 1. In consequence, the area around the opening in the insulating base 2 is inclined such that the opening 3 becomes gradually smaller in size from the lower surface as approaching the upper surface of the insulating base 2, thus forming the inclined portion 5 around the opening 3 of the green sheet stacked body.

By virtue of such an inclined portion 5, a space is left around the opening 3 at the lower surface, and this space helps restrain the area around the opening 3 against contact with the imaging element 10. Moreover, an inner edge of one of the plurality of light-transmission control layers 4a lies closer to the opening 3 than the inner edges of the other light-transmission control layers 4b as seen in the plan view of the imaging element mounting substrate 1 to provide the inclined portion 5. In this case, for example, in contrast to the case of forming a cutaway around the opening 3, it is possible to suppress an excessive decrease in the thickness of a part of the insulating base 2 located around the opening 3, and thereby reduce transmission of light through the part of the insulating base 2 located around the opening 3. Moreover, the light-transmission control layer 4 interposed between the insulating layers 2a achieves further reduction in light transmission successfully. This makes it possible to prevent entry of unnecessary light into the imaging element 10, and thereby obtain good images.

It is advisable that the plurality of light-transmission control layers 4 made of, for example, electrically insulating ceramics, are disposed so that their inner edges are spaced away from the outer edge of the opening 3 by a distance of 0.3 to 0.5 mm. With this arrangement, the thickness of a light-transmission control layer 4-free region of the insulating base 2 near the outer edge of the opening 3 can be minimized during pressure application for layer stacking operation.

In the case where the insulating base 2 is made of electrically insulating ceramics, the light-transmission control layer 4 is constituted by a light-transmission control metallic layer formed by metallization using a metal such as tungsten (W), molybdenum (Mo), manganese (Mn), silver (Ag), or copper (Cu), or a light-transmission control insulating layer made of an aluminum nitride sintered body, a silicon nitride sintered body, a glass ceramics sintered body, or the like.

In the case of constituting the light-transmission control layer 4 by the light-transmission control metallic layer, a metal paste prepared for the light-transmission control metallic layer 4 is printed in a predetermined shape onto the insulating layer 2a-forming green sheet by screen printing or otherwise. Next, the above-mentioned green sheets are stacked together so that the metal paste is located between the insulating layers 2a, and the stacked green sheets are fired. In this way, the metal-made light-transmission control layer 4 is formed between the plurality of insulating layers 2a. Such a metal paste is prepared by kneading powder of a metal such as tungsten, molybdenum, manganese, silver, or copper in admixture with suitable solvent and binder, and subsequently adjusting the viscosity of the kneaded product to an appropriate level. Moreover, the light-transmission control layer 4 constituted by the light-transmission control metallic layer may be electrically connected to the wiring conductor formed inside the insulating base 2. Furthermore, where the insulating base 2 is made of electrically insulating ceramics for example, with the light-transmission control layer 4 constituted by the light-transmission control metallic layer, transmission of light through the interior of the insulating base 2 can be reduced more effectively. This is because the electrically insulating ceramics may have a high content of a component having a high light transmittance such for example as a glass component, and thus, as compared with the insulating base 2 made of such electrically insulating ceramics, the light-transmission control metallic layer is less pervious to light with effectiveness.

The light-transmission control layer 4 constituted by the light-transmission control insulating layer is made of, for example, an aluminum oxide sintered body, a mullite sintered body, a silicon carbide sintered body, an aluminum nitride sintered body, a silicon nitride sintered body, or a glass ceramics sintered body, and, this light-transmission control layer 4 is formed by: forming a green sheet for forming the light-transmission control layer 4 similarly to the insulating layer 2a-forming green sheet; punching out a hole in this green sheet as an opening which is slightly larger than or has substantially the same size as the opening 3; placing the green sheet around the opening 3 so as to surround the opening 3; stacking the plurality of insulating layer 2a-forming green sheets together under pressure so that the light-transmission control layer 4-forming green sheet lies between the insulating layers 2a; and performing firing process. Alternatively, the light-transmission control layer 4 may be formed by printing, around the opening 3, a light-transmission control layer 4-forming ceramic paste containing a ceramic component which is substantially the same as that constituting the insulating layer 2a, with subsequent firing process being performed. Where the light-transmission control layer 4 is constituted by the light-transmission control insulating layer, for example, even if the light-transmission control layer 4 is brought into contact with the wiring conductor formed inside the insulating base 2, problems such as electrical short-circuiting will not occur, wherefore the imaging element mounting substrate 1 can be downsized with ease, and also, since the insulating base 2 and the light-transmission control layer 4 are made of similar materials, it follows that there is little difference in thermal expansion between the insulating base 2 and the light-transmission control layer 4 during a heating step in the course of the manufacture of the imaging element mounting substrate 1 or the installation of the imaging element 10, thus decreasing the possibility of occurrence of, for example, deformation around the opening 3.

Moreover, where the insulating base 2 is made of resin, the light-transmission control layer 4 is made of a metal material such as copper, gold, aluminum, nickel, chromium, molybdenum, titanium, or alloys of those metals, or is formed of an insulating layer made of resin (plastic) such as epoxy resin, polyimide resin, acrylic resin, phenol resin, polyester resin, or fluorine resin typified by tetrafluoroethylene resin.

The metal material-made light-transmission control layer 4 is laminated to the surface or the inside of the insulating base 2. The light-transmission control layer 4 is made of a metal material such as gold (Au), aluminum (Al), nickel (Ni), chromium (Cr), molybdenum (Mo), titanium (Ti), or alloys of those metals. For example, the light-transmission control layer 4 is formed by transferring copper foil, which has been worked into a wiring conductor form, onto a resin sheet made of glass epoxy resin, and then stacking and bonding the resin sheets bearing the transferred copper foil with an adhesive. Alternatively, the light-transmission control layer 4 may be formed by making metal foil or a metal column unitary with the resin-made insulating base 2, or by laminating such a material to the insulating base 2 by sputtering, vapor deposition, plating, or otherwise. Moreover, the metal material-made light-transmission control layer 4 may be caused to be electrically conducting with other wiring conductors.

In the case where the material used for the light-transmission control layer 4 and the insulating material used for the insulating base 2 are the same, for example, a difference in porosity may be given. For example, it is preferable that the light-transmission control layer 4 is made of a material which is lower in porosity than the material used for the insulating base 2. In this case, the light-transmission control layer 4 reduces light transmission more effectively. For example, the porosity difference can be produced by forming the light-transmission control layer 4 and the insulating base 2 in different manners. In the case where the material used for the light-transmission control layer 4 and the insulating material used for the insulating base 2 are the same, determination on a distinction between the light-transmission control layer 4 and the insulating layer 2a of the insulating base 2 may be made on the basis of porosity, for example.

In FIG. 2, there is shown a diagrammatic sketch of the light-transmission control layer 4 interposed between the insulating layers 2a according to the invention. FIG. 2 is a diagram of the construction shown in FIG. 1 in simplified form, illustrating only the four upper surface-side insulating layers 2a of the insulating base 2 shown in FIG. 1 as seen in the plan view of the imaging element mounting substrate 1 in a direction from a surface of an inter-insulating layer region y toward the upper surface. In FIG. 2, there are shown a light-transmission control layer 41 located in an inter-insulating layer region α, a light-transmission control layer 42 located in an inter-insulating layer region β, and a light-transmission control layer 43 located in the inter-insulating layer region y. In FIG. 2, the light-transmission control layer 43 is indicated by solid lines, the light-transmission control layer 42 is indicated by dotted lines, and the light-transmission control layer 41 is indicated by alternate long and short dashed lines. Note that FIG. 2 is an explanatory schematic diagram, and thus, while the light-transmission control layer 4 as exemplified in FIG. 2 is disposed so as to cover most part of the insulating base 2, in addition thereto, as another embodiment of the invention, at least a region where the inclined portion 5 is to be formed may remain free of the light-transmission control layer 4 for the formation of the inclined portion 5.

As practiced in the exemplification shown in FIG. 2, the light-transmission control layer 4 is so disposed that its opening surrounds the opening 3. As shown in FIG. 2(a), where the opening 3 is rectangular-shaped, by designing the light-transmission control layer 4 so that each side opposed to corresponding one of the sides of the opening 3 has a length which is substantially equal to or greater than the length of the corresponding side, it is possible to avoid lack of uniformity in the insulating layers 2a around the opening 3. Moreover, as practiced in the exemplification shown in FIG. 2(b), by imparting a frame-like form to the light-transmission control layer 4 so as to surround the opening 3, even if light enters into the insulating base 2, it is possible to suppress light transmission throughout the periphery of the opening 3.

Moreover, it is preferable that the light-transmission control layer 4 is darker in color than the insulating base 2. With the light-transmission control layer 4 bearing a color which is darker than the color of the insulating base 2, even if light enters the insulating base 2, the light can be absorbed successfully by the light-transmission control layer 4, thus reducing transmission of light through the interior of the insulating base 2 more satisfactorily. As used herein, a color which is darker than the color of the insulating base 2 refers to a black color or a nearly black color that is darker than the color of the insulating base 2, which can be checked by visual observation.

To render the light-transmission control layer 4 darker in color than the insulating base 2, for example, where the insulating base 2 is made of an aluminum oxide sintered body, it is desirable to use a W- or Mo-made light-transmission control metallic layer, or a light-transmission control insulating layer made of aluminum oxide having a higher content of pigments such as chromium that is darker in color than the insulating base 2.

Figure 4:
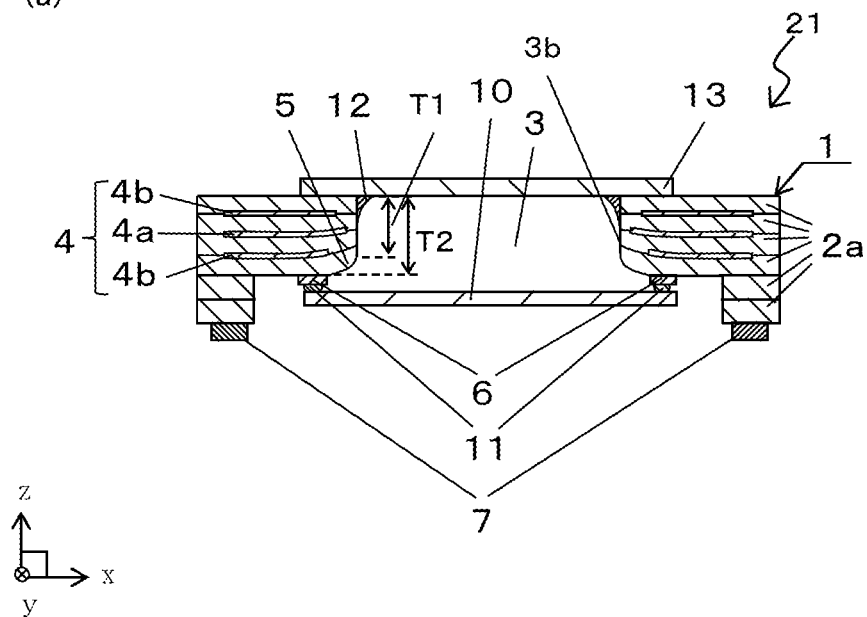
FIGS. 4(a) and 4(b) are each a longitudinal sectional view showing the imaging device in accordance with a second embodiment of the invention.
Figure 4:
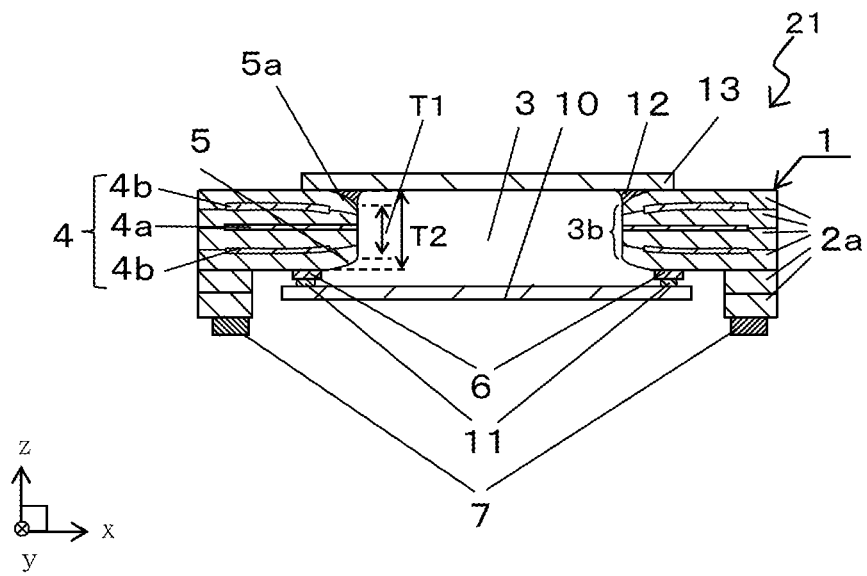

Moreover, as practiced in the exemplifications shown in FIGS. 1(b) and 3, and also FIG. 4 which will hereafter be explained, it is preferable that the inner edges of the plurality of light-transmission control layers 4 are located closer to the opening 3 than the connection electrode 6 as seen in the plan view of the imaging element mounting substrate 1. With this arrangement, the connection electrode 6 is not placed on the inclined portion 5 and may thus have a flat surface, wherefore the imaging element 10 and the connection electrode 6 can be connected to each other satisfactorily.

Moreover, as shown in FIG. 3, it is preferable that, an inner edge of one light-transmission control layer 4a of the plurality of light-transmission control layers 4, the inner edge being closer to the opening 3, overlaps the inner wall of the opening 3. This arrangement leaves no light-transmission control layer 4-free region in the vicinity of the opening 3 as seen in the plan view of the imaging element mounting substrate 1, wherefore light transmitted through the insulating base 2 can be further reduced. Moreover, as practiced in the exemplification shown in FIG. 3(b), by placing the light-transmission control layer 4a, whose inner edge is disposed so as to overlap the inner wall of the opening 3, between the plurality of insulating layers 2a, it is possible to reduce transmission of light through the interior of the insulating base 2 more effectively.

Moreover, as practiced in the exemplification shown in FIGS. 1 to 3, where, of the plurality of light-transmission control layers 4, the one light-transmission control layer 4a whose inner edge lies closer to the opening 3 is located nearest the upper surface of the insulating base 2, and the other light-transmission control layers 4b are disposed so that a distance between the inner edge and the opening 3 gradually increases as approaching the lower surface of the insulating base 2, then, during the stacking of green sheets for forming the plurality of insulating layers 2a under pressure, the region where the light-transmission control layers 4a overlap a little each other is smaller in thickness than the region where there is a full overlap of these layers as seen in the plan view of the imaging element mounting substrate 1 with consequent gradual decrease in thickness, thus facilitating the formation of the inclined portion 5 in the insulating layer constituting the lower surface of the insulating base 2. Moreover, since the one light-transmission control layer 4a whose inner edge lies closer to the opening 3 is located nearest the upper surface of the insulating base 2, it is possible to render the upper surface of the insulating base 2 flat, and thereby join the lid body 13 to the upper surface more satisfactorily. The imaging element mounting substrate 1 thereby constructed is suitable for use in the image quality-oriented imaging device 21 such as a single-lens reflex camera.

While the light-transmission control layer 4 is disposed between insulating layers 2a located closer to the upper surface from the connection electrode 6 to which is mounted the imaging element 10 in the exemplification shown in FIGS. 1 to 3, the insulating base 2 may have an inter-insulating layer 2a region free of the light-transmission reduction layer 4. As described above, by adjusting the number or thickness of the light-transmission control layers 4 disposed between the plurality of insulating layer 2a, for example, the inclination of the inclined portion 5 and the thickness of the insulating base 2 can be adjusted.

Moreover, it is preferable that a thickness T1 of an opening 3-side end 3b at the inclined portion 5 is set to about 75% to 95% of a thickness T2 of a part of the insulating base 2 located on an outside of the inclined portion 5. By setting the thickness T1 to be greater than or equal to 75% of the thickness T2, it is possible to render the insulating base 2 impervious to light, and thereby suppress entry of unnecessary light into the imaging element 10. Moreover, by setting the thickness T1 to be less than or equal to 95% of the thickness T2, it is possible to restrain the area around the opening 3 in the insulating base 2 against contact with the imaging element 10 effectively.

The imaging element 10 is mounted on the imaging element mounting substrate 1. For example, the imaging element 10 is a CCD-type imaging element or a CMOS-type imaging element. In the exemplification shown in FIGS. 1 and 3, each electrode of the imaging element 10 is electrically connected to the connection electrode 6 via a connecting member 11 (gold bump or the like). In addition to the gold bump, for example, solder may be used for the connection electrode 6. At the same time, the insulating base 2 and the imaging element 10 are bonded to each other at the outer periphery by a sealing material (not shown) such as resin, so that the light-receiving surface may be hermetically sealed against outside air. Moreover, the lid body 13 is mounted on the insulating base 2. The lid body 13 is made of a light-transmitting member such as quartz or glass, and, the lid body 13 is joined to a position overlapping the imaging element 10 as seen in the plan view of the imaging element mounting substrate 1.

The following describes a method for manufacturing the imaging element mounting substrate 1 according to the present embodiment.

(1) First, a green sheet constituting the insulating base 2 is formed. For example, in the case of obtaining the insulating base 2 made of an aluminum oxide ($Al_2O_3$) sintered body, for example, powder of silica ($SiO_2$), magnesia (MgO), or calcia (CaO) serving as a sintering aid is added to $Al_2O_3$ powder, and, after further addition of suitable binder, solvent, and plasticizer, the powder mixture thus obtained is kneaded to form a slurry. After that, a segmentable green sheet is obtained by a heretofore known molding technique such as the doctor blade method or the calender roll method.

In the case where the insulating base 2 is made of resin for example, the insulating base 2 may be formed by molding the resin by transfer molding, injection molding, or otherwise using a mold capable of providing a molded body of predetermined shape. Moreover, the insulating base 2 may be made of a resin-impregnated base material made of glass fiber, such as glass epoxy resin. In this case, the insulating base 2 may be formed by impregnating a glass fiber-made base material with a precursor of epoxy resin, and subsequently curing the epoxy resin precursor under heat at a predetermined temperature.

(2) In the green sheet so obtained, a metal paste is print-coated to or charged into certain areas corresponding to the connection electrode 6, the internal wiring conductor, and the external electrode 7 by screen printing or otherwise. By firing the metal pastes simultaneously with a green sheet for forming the insulating base 2, the connection electrode 6 disposed at the stepped portion, the external electrode 7 disposed on an area corresponding to the lower surface, the upper surface, or the side surface of the insulating base 2, and the wiring conductor including an internal wiring or a through conductor are formed. The metal paste is prepared by kneading powder of a metal such as tungsten, molybdenum, manganese, silver, copper, or the like in admixture with suitable solvent and binder, and subsequently adjusting the viscosity to an appropriate level. Glass or ceramics may be included in the metal paste to enhance the strength of adhesion with the insulating base 2. Moreover, at this time, by print-coating, for example, a metal paste or a ceramic paste for forming the light-transmission control layer 4 similarly to the green sheet around the opening 3 so that a metal or ceramic paste for forming the light-transmission control layer 4 is located between green sheets for forming the insulating layers 2a, the light-transmission control layer 4 constituted by the light-transmission control metallic layer or the light-transmission control insulating layer can be also prepared.

(3) The green sheets for forming the insulating layer 2a are stacked together under pressure to form a green sheet stacked body. At this time, instead of the metal or ceramic paste for forming the light-transmission control layer 4, a green sheet for forming the light-transmission control layer 4 as above described may be placed between the green sheets for forming the insulating layer 2a, and, in this case, by stacking these green sheets together under pressure at one time, the light-transmission control layer 4 constituted by an insulating light-transmission control layer can be also prepared.

As shown in FIG. 1(b), in the case of forming the inclined portion 5 inclined upwardly (inclined such that the opening 3 becomes gradually smaller in size from the lower surface as approaching the upper surface of the insulating base 2), during pressurization of the green sheet stacked body, with the upper surface kept in contact with a flat plate, a pressure is applied to the stacked body from below the lower surface.

(4) The green sheet stacked body is fired at a temperature in the range of about 1500 to 1800° C. to obtain a segmentable substrate in the plurality of insulating bases 2 are disposed. In this process step, the aforementioned metal pastes become the connection electrode 6, the external electrode 7, and the wiring conductor, respectively.

(5) The segmentable substrate obtained through the firing process is divided into the plurality of insulating bases 2. The division can be accomplished by a technique to break the segmentable substrate along split grooves formed in the positions thereof corresponding to the outer edges of the insulating bases 2, or a technique to cut the segmentable substrate along the positions thereof corresponding to the outer edges of the insulating bases 2 by slicing or otherwise. While the split grooves may be formed by making, in the segmentable substrate, small incisions whose dimensions are smaller than the thickness of the segmentable substrate with a slicing machine after the firing process, alternatively, the split grooves may be formed by pressing a cutter blade against a green sheet stacked body for forming the segmentable substrate, or by making, in the green sheet stacked body for forming the segmentable substrate, small incisions whose dimensions are smaller than the thickness of the green sheet stacked body with a slicing machine.

On the imaging element mounting substrate 1 thus constructed, the imaging element 10 is mounted, and, the imaging element mounting substrate 1 equipped with the imaging element 10 is installed in an external circuit board (not shown), thus allowing the imaging element 10 to make electrical connection with the external circuit board via the connection electrode 6, the external electrode 7, and so forth.

The imaging element 10 is flip-chip mounted on the imaging element mounting substrate 1 thus constructed so as to overlap the opening 3 as seen in the plan view of the imaging element mounting substrate 1, and, each electrode of the imaging element 10 is electrically connected to corresponding one of the plurality of connection electrodes 6 formed on the lower surface of the insulating base 2 via the connecting member 11 such as a gold bump. Moreover, as a so-called underfill material, for example, a sealing material (not shown) made of resin such as epoxy resin is injected, through the opening 3, in between the imaging element mounting substrate 1 and the imaging element 10, and the lid body 13 is joined to the upper surface of the insulating base 2 so as to cover the opening 3. In this way, the imaging device 21 is constructed.

Instead of the aforementioned connecting member 11 such as a gold bump, a connecting member 11 made of solder or electrically conductive resin (such as anisotropic conductive resin) may be used to establish electrical connection between the individual electrodes of the imaging element 10 and their respective connection electrodes 6.

For example, the imaging element 10 is a semiconductor device such as a CCD-type electronic device or a CMOS-type imaging element.

(Second Embodiment)

Next, the imaging device 21 in accordance with a second embodiment of the invention will be described with reference to FIG. 4.

The imaging device 21 of this embodiment differs from the imaging device 21 of the foregoing first embodiment in the placement position of the one light-transmission control layer 4a, the shape of the insulating base 2, and a joining condition of a joining member 12.

In the exemplification shown in FIG. 4, the one light-transmission control layer 4a is placed between the insulating layers 2a located in an intermediate part of the insulating base 2 to reduce the thickness of the area around the opening 3 in the insulating base 2, as well as to reduce transmission of light through the insulating base 2. As practiced in the second embodiment, by changing the position between the insulating layers 2a in which the one light-transmission control layer 4a is placed, the angle of inclination of the inclined portion 5 can be adjusted. Moreover, as practiced in the exemplification shown in FIG. 4(b), the other light-transmission control layers 4b, which are located above and below, respectively, the one light-transmission control layer 4a located in the intermediate part of the insulating base 2, are disposed so that their inner edges lie at the same position as seen in the plan view of the imaging element mounting substrate 1. In this case, in the insulating base 2, like the lower surface side, the upper surface side is also formed with another inclined portion 5a. In the presence of the other inclined portion 5a, in joining the lid body 13, the joining member 12 is capable of constituting a fillet satisfactorily along the other inclined portion 5a. This helps increase the strength of adhesion between the insulating base 2 and the lid body 13. Moreover, the use of the joining member 12 of dark color such as black enables absorption of light transmitted through the joining member 12, thus achieving reduction in noise in an image. Moreover, as practiced in the exemplification shown in FIG. 4(b), by virtue of the other inclined portion 5a formed at the upper surface of the insulating base 2, an excess amount of the joining member 12 can be accommodated in the other inclined portion 5a. This makes it possible to suppress the flow of the joining member 12 toward the opening 3, and thereby suppress, for example, appearance of the shadow of the joining member 12 on an image.

The insulating base 2 and the lid body 13 are joined to each other via the joining member 12 such as resin or glass.

As practiced in the exemplification shown in FIG. 4(a), in forming the insulating base 2 having the inclined portion 5 only at its lower surface, a pressurizing method similar to that adopted in the formation of the inclined portion 5 of the foregoing exemplification shown in FIG. 1 is adopted. On the other hand, as practiced in the exemplification shown in FIG. 4(b), in forming the insulating base 2 having the inclined portion 5 at its lower surface and the other inclined portion 5a at its upper surface, pressurization of the green sheet stacked body is effected so that a pressure is applied to the stacked body both from below the lower surface and from above the upper surface uniformly.

(Third Embodiment)

Next, the imaging device 21 in accordance with a third embodiment of the invention will be described with reference to FIG. 5.

The imaging device 21 of this embodiment differs from the imaging device 21 of the foregoing first embodiment in that the one light-transmission control layer 4a is disposed at the layer located nearest the imaging element 10.

Figure 5:
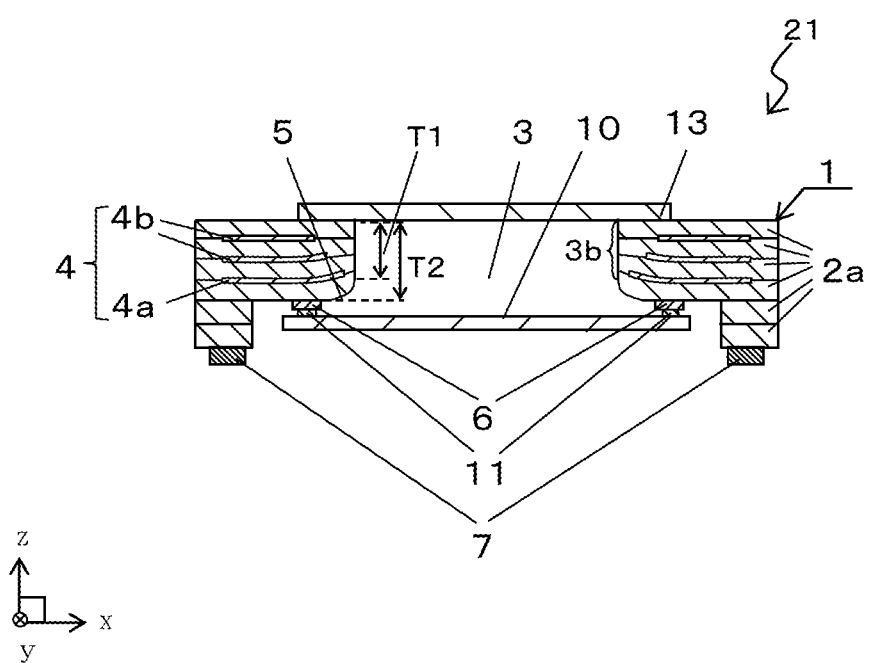
FIG. 5 is a longitudinal sectional view showing the imaging device in accordance with a third embodiment of the invention.

As practiced in the exemplification shown in FIG. 5, of the plurality of light-transmission control layers 4, the one light-transmission control layer 4a whose inner edge lies closest to the opening 3 is located nearest the lower surface of the insulating base 2, and, the other light-transmission control layers 4b are disposed so that a distance between the inner edge and the opening 3 gradually increases as approaching the upper surface of the insulating base 2. Thus, when the one light-transmission control layer 4a is spaced only a short distance away from the imaging element 10, in contrast to a case where the one light-transmission control layer 4a is distant from the imaging element 10, the one light-transmission control layer 4a to the imaging element 10 spacing is small, wherefore the range of travel of irregularly reflected light or light refracted by the one light-transmission control layer 4a between the one light-transmission control layer 4a and the imaging element 10 can be reduced. This makes it possible to reduce occurrence of noise such as flare during reception of light in the imaging element 10, and thereby take more satisfactory images.

Even with the arrangement of the light-transmission control layers 4 as shown in FIG. 5, as is the case with the exemplification shown in FIG. 1, by effecting pressurization of the green sheet stacked body so that, with the upper surface kept in contact with a flat plate, a pressure is applied to the stacked body from below the lower surface, it is possible to form the upwardly inclined portion 5.

It should be understood that the application of the invention is not limited to the exemplificative embodiments described heretofore, and that various modifications are possible.

For example, the opening 3 of the insulating base 2 may be given a circular shape or other polygonal shape, rather than a rectangular shape.

Moreover, no special limitations are imposed upon the arrangement, the number, the shape, etc., of the connection electrodes 6 and the external electrodes 7 in the embodiments.

The invention claimed is:

1. An imaging element mounting substrate, comprising:
an insulating base comprising a plurality of insulating layers, a surface of the insulating base comprising an opening which is located at a center of the insulating base;
a connection electrode disposed at a lower surface of the insulating base around the opening, the connection electrode connectable to an imaging element; and
a plurality of light-transmission control layers which are between the plurality of insulating layers, respectively, the plurality of light-transmission control layers surrounding the opening, being disposed overlapping one another in large part as seen in a plan view of the imaging element mounting substrate, and comprising inner edges located on an outside of the opening,
an inner edge of one of the plurality of light-transmission control layers lying closer to the opening than an inner edge of another one of the plurality of light-transmission control layers as seen in the plan view of the imaging element mounting substrate,
the insulating base having, in an inner periphery of the opening of an insulating layer constituting a lower surface of the insulating base, an inclined portion which is inclined such that the opening becomes smaller in size from the lower surface as approaching an upper surface of the insulating base.

2. The imaging element mounting substrate according to claim 1,
wherein, of the plurality of light-transmission control layers, the one light-transmission control layer whose inner edge lies closer to the opening is located nearest the upper surface of the insulating base, and
the another one of the plurality of light-transmission control layers is disposed so that a distance between the inner edge and the opening gradually increases as approaching the lower surface of the insulating base.

3. The imaging element mounting substrate according to claim 1,
wherein, of the plurality of light-transmission control layers, the one light-transmission control layer whose inner edge lies closer to the opening is located nearest the lower surface of the insulating base, and
the another one of the plurality of light-transmission control layers is disposed so that a distance between the inner edge and the opening gradually increases as approaching the upper surface of the insulating base.

4. The imaging element mounting substrate according to claim 1,
wherein at least one of the plurality of light-transmission control layers is darker in color than the insulating base.

5. The imaging element mounting substrate according to claim 1,
wherein, an inner edge of one of the plurality of light-transmission control layers, the inner edge being closer to the opening, overlaps an inner wall of the opening.

6. The imaging element mounting substrate according to claim 1,
wherein the inner edges of the plurality of light-transmission control layers are located closer to the opening than the connection electrode as seen in the plan view of the imaging element mounting substrate.

7. The imaging element mounting substrate according to claim 1,
wherein the plurality of light-transmission control layers have a frame-like form.

8. The imaging element mounting substrate according to claim 1,
wherein the insulating base has an inter-insulating layer region free of the light-transmission control layer.

9. An imaging device comprising:
the imaging element mounting substrate according to claim 1; and
an imaging element connected to the connection electrode.

* * * * *